(12) United States Patent
Claret et al.

(10) Patent No.: US 12,713,840 B2
(45) Date of Patent: Aug. 18, 2026

(54) RADIO FREQUENCY SWITCH

(71) Applicant: COMMISSARIAT À L'ENERGIE ATOMIQUE ET AUX ENERGIES ALTERNATIVES, Paris (FR)

(72) Inventors: Thierry Claret, Grenoble Cedex (FR); Bruno Reig, Grenoble Cedex (FR); Denis Mercier, Grenoble Cedex (FR)

(73) Assignee: COMMISSARIAT À L'ENERGIE ATOMIQUE ET AUX ENERGIES ALTERNATIVES, Paris (FR)

( * ) Notice: Subject to any disclaimer, the term of this patent is extended or adjusted under 35 U.S.C. 154(b) by 375 days.

(21) Appl. No.: 18/478,338

(22) Filed: Sep. 29, 2023

(65) Prior Publication Data

US 2024/0114809 A1 Apr. 4, 2024

(30) Foreign Application Priority Data

Sep. 30, 2022 (FR) ...................................... 2209989

(51) Int. Cl.
*H10N 70/00* (2023.01)
*H10N 79/00* (2023.01)
*H10N 70/20* (2023.01)

(52) U.S. Cl.
CPC ....... *H10N 70/823* (2023.02); *H10N 70/8413* (2023.02); *H10N 79/00* (2023.02); *H10N 70/231* (2023.02); *H10N 70/8828* (2023.02)

(58) Field of Classification Search
None
See application file for complete search history.

(56) References Cited

U.S. PATENT DOCUMENTS

| | | | | |
|---|---|---|---|---|
| 9,865,654 | B1 * | 1/2018 | He | H10B 63/30 |
| 2016/0056373 | A1 * | 2/2016 | Goktepeli | H10B 63/22 257/2 |
| 2020/0058581 | A1 * | 2/2020 | El-Hinnawy | H10W 20/495 |
| 2020/0058703 | A1 * | 2/2020 | Slovin | H10N 39/00 |
| 2022/0367522 | A1 * | 11/2022 | Willard | H03K 17/063 |
| 2023/0397510 | A1 * | 12/2023 | Li | H10N 70/066 |

OTHER PUBLICATIONS

Search Report as issued in French Patent Application No. FR2209989, dated May 15, 2023.

(Continued)

*Primary Examiner* — Bilkis Jahan
(74) *Attorney, Agent, or Firm* — CUSHMAN PARTNERS, LLC

(57) ABSTRACT

A radio-frequency switch able to establish or break transmission of a radio-frequency signal, the switch including a first conductive finger, a second conductive finger, transmission of the radio-frequency signal taking place between the first conductive finger and the second conductive finger, at least one conductive electrode and a layer made of a PCM material having a lower surface and an upper surface. The first and second conductive fingers are spaced apart by a non-zero distance and in contact with the lower surface of the PCM layer. The conductive electrode is in contact with the upper surface of the PCM layer.

15 Claims, 7 Drawing Sheets

(56) References Cited

OTHER PUBLICATIONS

Léon, A., et al., "RF Power-Handling Performance for Direct Actuation of Germanium Telluride Switches," IEEE Transactions On Microwave Theory and Techniques, vol. 68, No. 1, Oct. 2019, XP011765232, pp. 60-73.

Wang, M., et al., "Development and evaluation of germanium telluride phase change material based ohmic switches for RF applications," Journal of Micromechanics and Microengineering, Institute of Physics Publishing, vol. 27, No. 1, Nov. 2016, XP020311974, 9 pages.

Bettoumi, I., et al., "Phase Change Material (PCM) RF Switches With Integrated Decoupling Bias Circuit," IEEE Microwave and Wireless Components Letters, vol. 32, No. 1, Oct. 2021, XP011896720, pp. 52-55.

El-Hinnawy, N., et al., "A four-terminal, inline, chalcogenide phase-change RF switch using an independent resistive heater for thermal actuation," IEEE Electron Device Letters, vol. 34, No. 10, Oct. 2013, pp. 1313-1315.

Wang, M., et al., "Directly heated four-terminal phase changes switches," IEEE MTT-S Int. Symp., Jun. 2014, 4 pages.

Shim, Y., et al., "RF switches using phase change materials," IEEE Int. Conf. Microeletromech. Syst., Jan. 2013, pp. 237-240.

* cited by examiner

[Fig. 1]
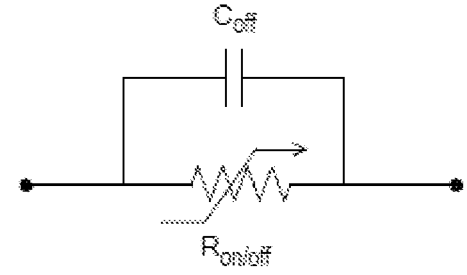
[Fig. 2]
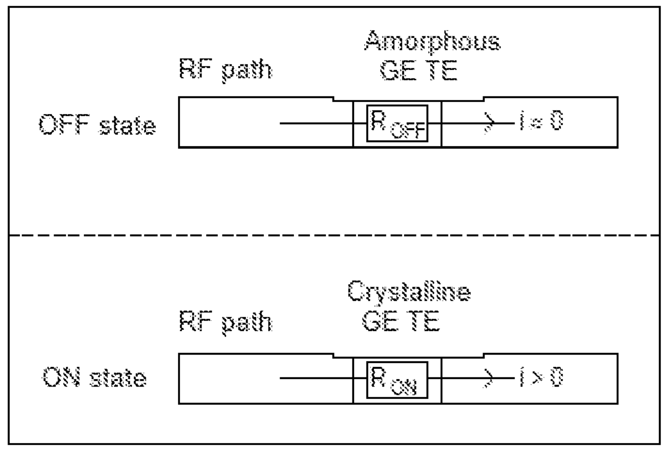
[Fig. 3]
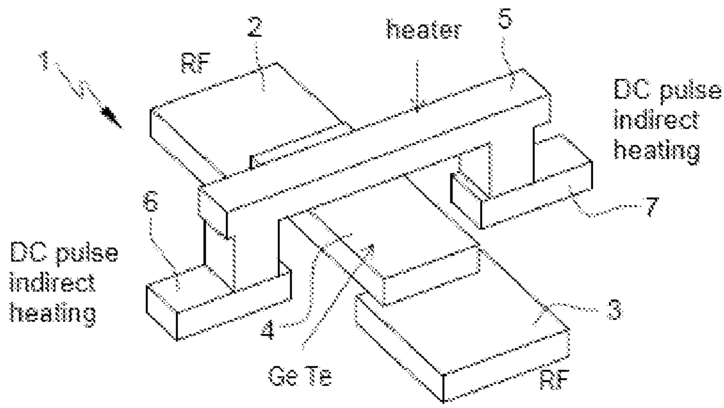

[Fig. 4]
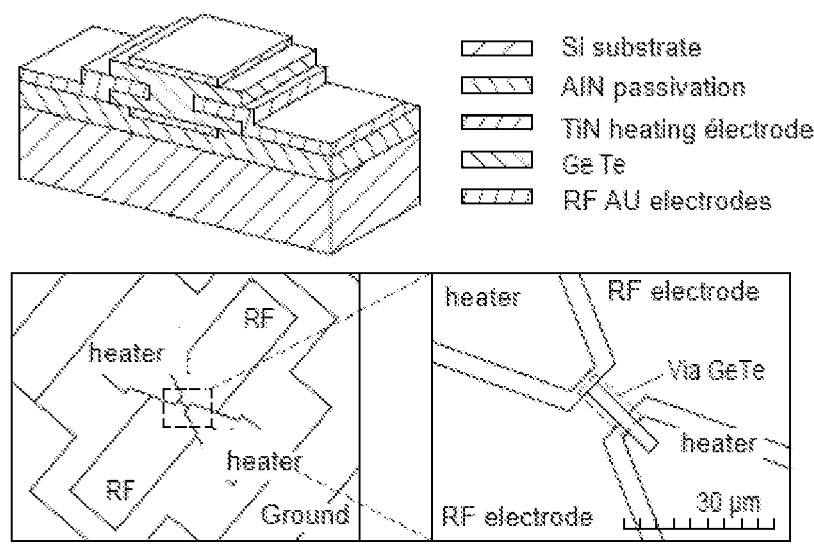
[Fig. 5]
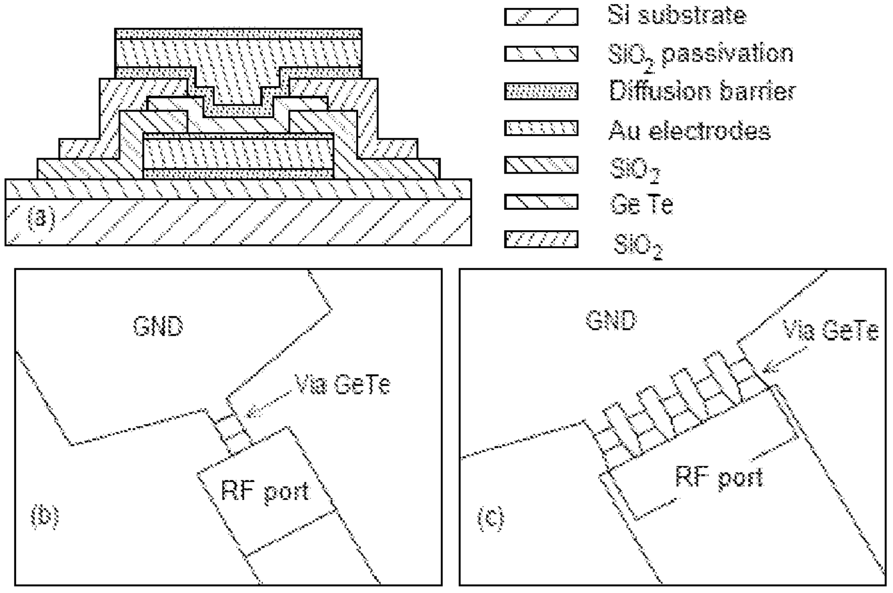

[Fig. 6]
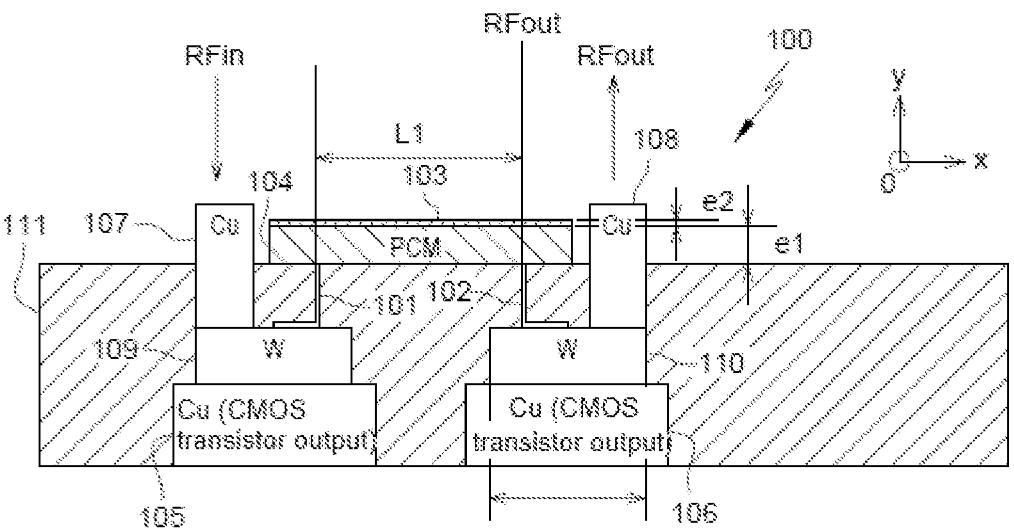
[Fig. 7]
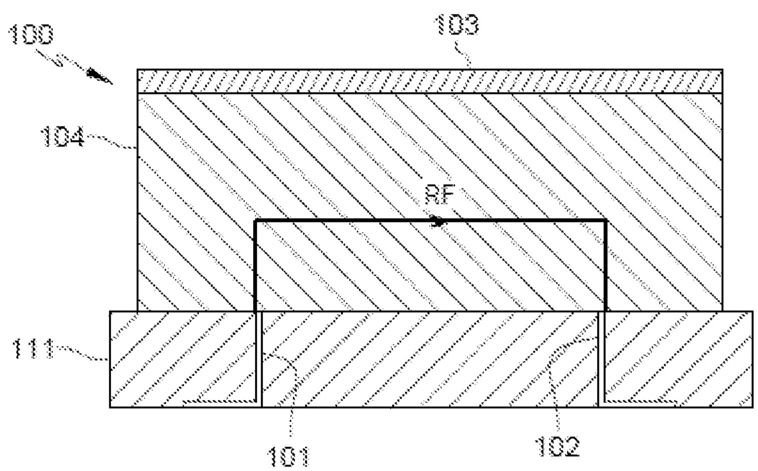
[Fig. 8]
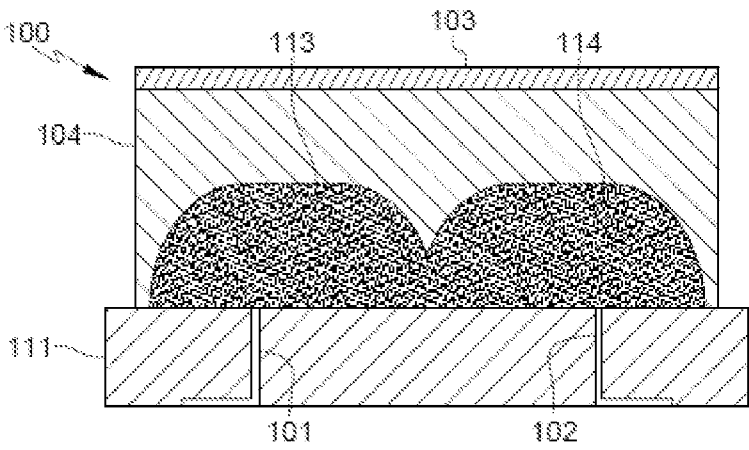

[Fig. 9]
100
113
103
114
104
111
101
102
[Fig. 10]
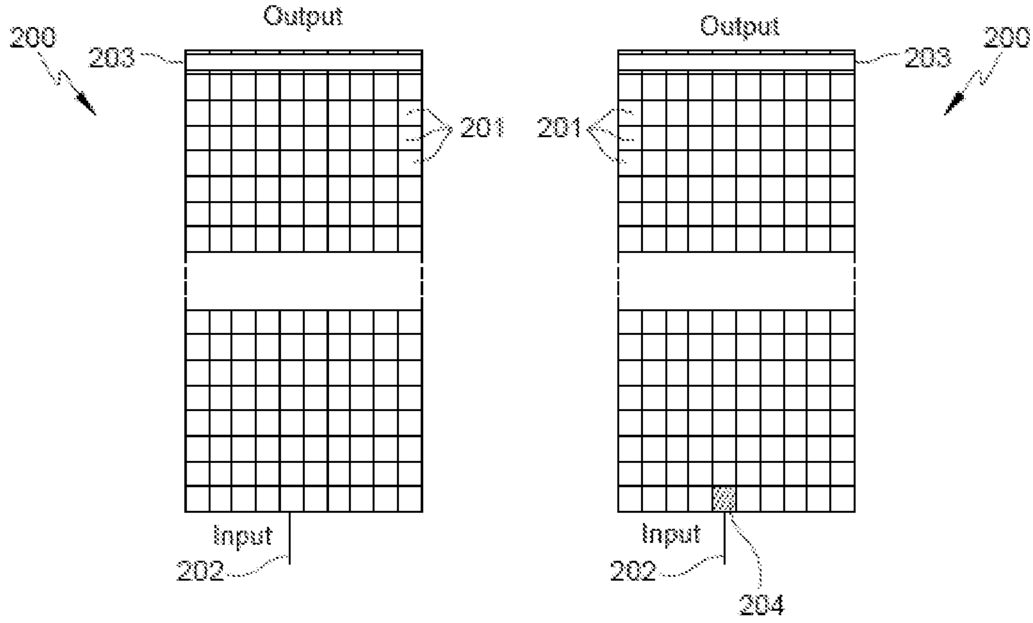

[Fig. 11]
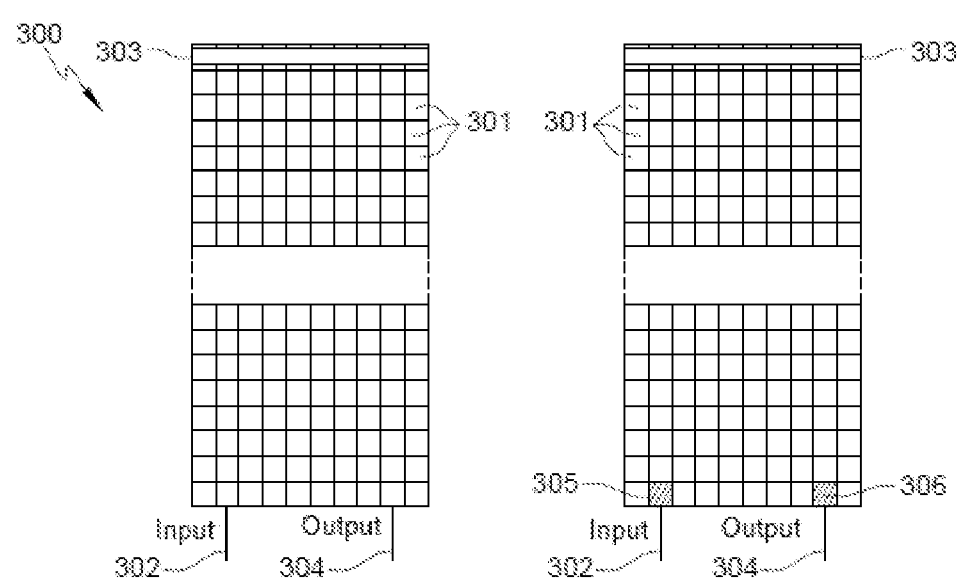
[Fig. 12]
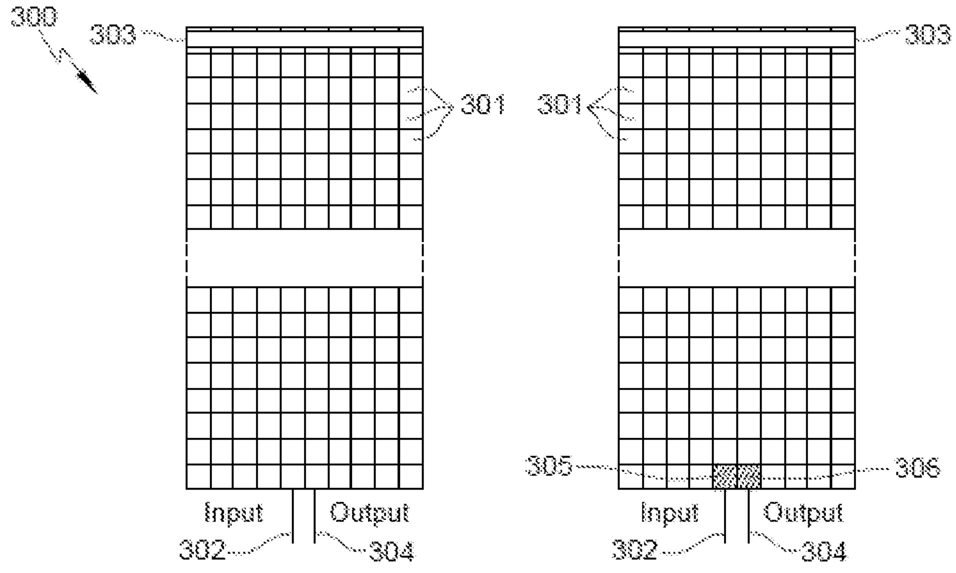

[Fig. 13]
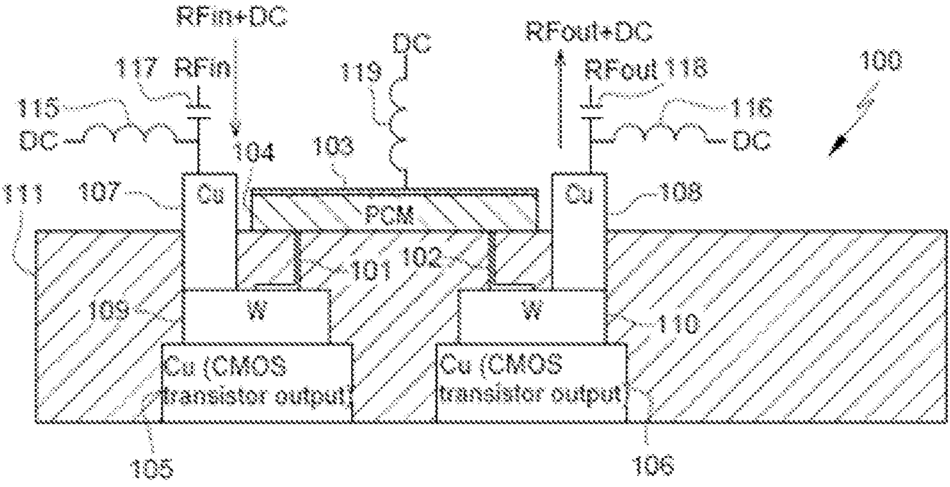
[Fig. 14]
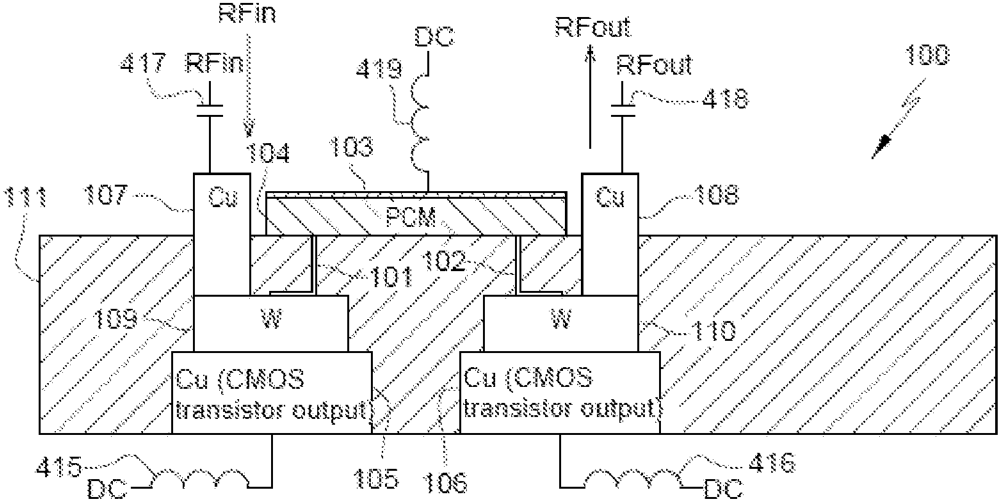

[Fig. 15]
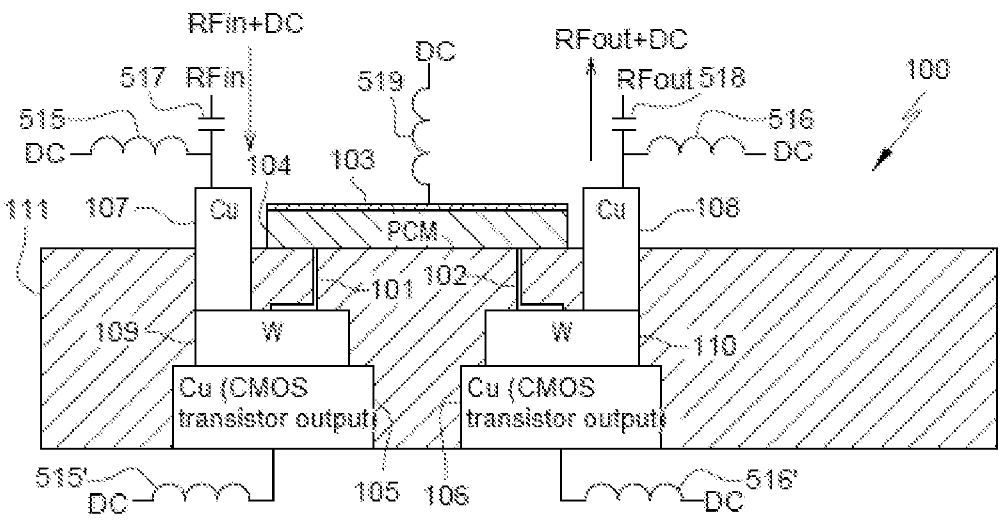

RADIO FREQUENCY SWITCH

CROSS-REFERENCE TO RELATED APPLICATIONS

This application claims priority to French Patent Application No. 2209989, filed Sep. 30, 2022, the entire content of which is incorporated herein by reference in its entirety.

FIELD

The present invention relates to radio frequency switches used especially but not exclusively in the field of telecommunications.

BACKGROUND

In the field of wireless telecommunications, developments have focused on the design of flexible radio frequency (RF) architectures with the integration of frequency-agile components (tunable filters and antennas). One well-known solution for ensuring this agility is to use components referred to as RF switches, especially to adapt the response of devices to several frequencies. An RF switch is used not only for frequency tuning, but also for selecting the signal path in a switching device or network. More generally, RF switches serve as a frequency band selection device in transmit-receive modules, as a device for reconfiguring the operating frequency or the radiation pattern of an antenna, as a routing device between a receiving part and a transmitting part, or as an impedance, especially capacitive, matching device.

An RF switch is a switch operating in the radio frequency range (i.e. from a few kHz to several hundred GHz), or even beyond in the case of applications in the order of a few THz for medical imaging.

This type of switch can be represented by an equivalent circuit, as illustrated in FIG. 1, which has a resistance Ron in the ON state (low resistive) and a capacitance Coff in the OFF state (high resistive). The electrical performance of an RF switch is evaluated by the Ron and Coff values, and also by the value of the Roff resistance in the OFF state. The Ron value provides information about insertion losses in the ON state: the lower the Ron, the lower the losses. The Coff value provides information about the level of insulation in the OFF state: the lower the Coff value, the higher the level of insulation. Furthermore, in addition to a low Ron value and a low Coff value, it will also be sought to have the highest possible Roff value and therefore the highest possible Roff/Ron ratio. The performance of RF switches can be characterised by a Figure Of Merit (FoM) defined by: FoM=Ron×Coff expressed in femtoseconds. The lower the FoM, the closer the switch performance to that of an ideal switch. Another expression of FoM found in the literature is the Cut-Off Frequency (Fc), defined as follows: $Fc=1/(2\pi \, Ron \times Coff)$ expressed in THz, which also reflects the switch electrical performance: the higher the Fc value, the closer the switch performance is to that of an ideal switch. In addition, the efficiency of a switch also depends on its switching speed between both states, its power consumption, its size, its power handling capacity, its reliability and its ability to be integrated into a CMOS manufacturing process.

The most widely used technology for making RF switches is currently based on semiconductors and more particularly on MOS (Metal Oxide Semiconductor) transistors on SOI (Silicon On Insulator) substrates. This technology gives good results, especially in terms of reliability and endurance, low switching energy (between 50 fJ and 1 pJ) and fast switching time (between 1 and 100 ns), but has limitations in terms of figure of merit, with a FoM that can range from 0.5 to 2 THz. Another drawback of this technology relates to the need to apply a static control voltage to the transistor gate for as long as it is desired to maintain it in a specific state; in other words, the technology is volatile and leads to static power consumption.

RF switches based on MEMS (Micro-Electro-Mechanical System) devices are also known, with good electrical performance and a FoM of up to 50 THz. The drawback of this type of component is a high switching time (1 μs at best).

Another known technology for making RF switches is based on the use of phase change materials (PCMs) such as GeTe-type chalcogenide materials. The principle of PCM materials is based on a reversible change in the material from an amorphous state (with a disordered arrangement of atoms) to a crystalline state (with an ordered arrangement of atoms). The structural difference between the amorphous and crystalline states results in a change in the electrical properties of the material. In the amorphous state the material has a high electrical resistivity, and in the crystalline state the material is characterised by a low electrical resistivity. The operation of a PCM RF switch is illustrated in FIG. 2. The switch is a device in which the two RF electrodes are connected to a zone made of a PCM material such as GeTe, said zone being either in a Roff state (i.e. high resistive) when the PCM material is in an amorphous state or in a Ron state (i.e. low resistive) when the PCM material is in a crystalline state. Reversible switching between the crystalline and amorphous states is achieved by a specific heat treatment (i.e. controlled heating or cooling of the material) obtained by sending electrical pulses through a heater. As both the amorphous and crystalline states are stable, there is no need to maintain a control current/voltage to maintain one state so the PCM RF switch has non-volatile behaviour, providing an effective solution for reducing power consumption. PCM RF switches additionally have better FoMs than transistors and a large contrast in resistivity between both states, as well as very low resistivity in the crystalline state, making it possible to produce switches with low insertion losses.

Two categories of PCM RF switches are known: the first are indirectly actuated while the second are directly actuated.

One example of an indirectly actuated switch is illustrated in FIG. 3. The switch 1 in FIG. 3 includes two RF electrodes 2 and 3 interconnected by a PCM pattern 4. The switch 1 also includes a heater 5 arranged orthogonally to the RF line and not in contact with the PCM pattern 4. A dielectric material (not represented here) is generally found between the heater 5 and the PCM pattern 4. The dielectric layer plays a dual role. Firstly, it electrically insulates the heater from the rest of the circuit (RF electrodes 2 and 3 and PCM material 4) and secondly, it thermally couples the heater 5 and the PCM pattern 4. Heating of the PCM material is indirect, as the electrical actuation pulses are applied to the heater (which is not in electrical contact with the PCM material) via its inputs/outputs 6 and 7. The heater 5 heats by Joule effect and heat generated is transmitted indirectly by thermal radiation to the PCM pattern 4 through the dielectric layer. As a result, the PCM material changes its electrical properties (resistivity), thereby modifying the impedance seen between the two RF electrodes 2 and 3. The dielectric material has to be as thick an electrical insulator as possible to limit parasitic capacitances between the heater on one side and the PCM pattern and RF electrodes on the other. It also has to be as thin a thermal conductor as possible so that the temperature required for the phase change passes as quickly as possible between the heater and the PCM pattern at the lowest possible energy cost. The best compromise should therefore be found for the dielectric thickness between thermal conductivity and electrical insulation.

One exemplary embodiment of an indirectly actuated structure is especially described in the article "A four-terminal, inline, chalcogenide phase-change RF switch using an independent resistive heater for thermal actuation" (El-Hinnawy et al., Electron Device Letters, 2013) in which the heater is located under the PCM pattern. Other indirectly actuated RF switches are also known in which the heater is located above the PCM pattern. The main drawbacks of indirectly actuated PCM switches are the switching time (in the order of 100 to 1000 ns), which remains high compared with semiconductor technologies (due to the large volume of PCM material to be switched), and the high power consumption (in the order of 1 to 500 nJ) required to switch the material between both states.

In order to limit power consumption, the paper "Directly heated four-terminal phase changes switches" (Wang et al. IEEE MTT-S Int. Symp., June 2014) describes a directly actuated PCM RF switch structure as illustrated in FIG. 4. The device is a switch with four metal terminals: two RF electrodes and two DC electrodes used for heating the PCM material. As shown in FIG. 4, a layer of GeTe is connected horizontally to the RF electrodes of Au (forming the horizontal RF path) and vertically to the DC electrodes of TiN (forming the vertical heating path). To switch state of the GeTe from crystalline to amorphous, current pulses are applied between the two resistive TiN heating electrodes and heat induced by the Joule effect is transmitted directly to the material, which changes its properties. In this case, it is the current density supplied by the heating electrodes through the PCM material that produces the heating required for the phase change. As a result, the impedance seen between the two electrodes will switch between high and low values depending on the state of the GeTe (amorphous or crystalline). The structure of FIG. 4 improves power consumption. However, the switching time remains long due to the volume of PCM material used in each via whereon it is deposited.

The paper "RF switches using phase change material" (Shim et al., IEEE Int. Conf. Microeletromech. Syst., January 2013) describes another example of a directly actuated PCM RF switch architecture illustrated in FIG. 5. Here, the switch includes RF electrodes of gold (Au) that also act as heating electrodes to actuate the GeTe pattern disposed between both electrodes. The RF signal and the actuating DC current pulse therefore follow the same vertical path. As in the previous example, the switching time remains long because of the volume of PCM material used in each via whereon it is deposited. Such an architecture also requires the use of several vias each receiving a GeTe pattern in order to reduce the Ron resistance: it is therefore difficult to switch all the vias, especially when one of them has switched to the ON state.

The phase change is obtained by a thermal pulse created by Joule effect from a current pulse in the heater (indirect heating) or directly in the material (direct heating). To switch from the amorphous state to the crystalline state, the PCM material is heated to relatively low temperatures (about 150° C. to 350° C. according to the type of material used) for a relatively long time (in the order of one μ-second) so that the material reorganises into its crystalline state. To switch from a crystalline to an amorphous state, the material is heated to high temperatures (from 600 to 1000° C. according to the type of material used) for a shorter period of time (from about ten to a hundred nanoseconds) to melt the material. The signal is then switched off to allow the material to cool sufficiently quickly to achieve thermal quenching of the material. The PCM material then freezes in an amorphous state without having time to reform into a crystal.

SUMMARY

There is therefore a need for a PCM-based RF switch having FoMs comparable to those of known PCM-based RF switches while limiting power consumption required for switching and reducing the switching time.

To this end, an aspect of the invention is a switch able to establish or break transmission of a radio frequency signal, said switch including:

A first conductive finger;

A second conductive finger, the transmission of said radio frequency signal taking place between the first conductive finger and the second conductive finger;

At least one conductive electrode;

A layer made of a phase-change material, referred to as a PCM layer, the phase-change material being able to change state between a crystalline state and an amorphous state, the PCM layer having a lower surface and an upper surface;

the first and second conductive fingers being spaced apart by a non-zero distance and in contact with the lower surface of the PCM layer;

the conductive electrode being in contact with the upper surface of the PCM layer;

Conveying an actuation signal through the PCM layer between the first conductive finger and the conductive electrode modifying state of the phase change material in a first zone between the first conductive finger and the conductive electrode;

Conveying an actuation signal through the PCM layer between the second conductive finger and the conductive electrode modifying state of the phase change material in a second zone between the second conductive finger and the conductive electrode;

such that when the first and second zones of the phase change material are in the crystalline state they allow the radio frequency signal to be conveyed between the first conductive finger and the second conductive finger through the PCM layer, and when the first and second zones of the phase change material are in the amorphous state, they prevent the radio frequency signal from being conveyed between the first conductive finger and the second conductive finger through the PCM layer.

Aspects of the invention are based on the manufacture of a PCM RF switch from an extrapolation of the technology used for the production of PCRAM (Phase Change RAM) type non-volatile resistive memories but using the equivalent of at least two memory points in series on a same continuous layer of PCM material.

Thus, unlike PCM RF switches known in the state of the art which require complete or almost complete switching from one state to another for the switch to operate correctly (i.e. to have sufficiently high Roff/Ron ratios), the switch according to an aspect of the invention is based on switching of at least two zones to the same state, the two zones being able to partially overlap or not. In other words, the switch according to an aspect of the invention does not require the complete switching of the material of the PCM layer to its crystalline or amorphous state, but only the switching of two zones produced in a same PCM layer. Each of both zones is formed between the upper surface and lower surface of the PCM layer (i.e. vertically with respect to the horizontal plane of the PCM layer). For this at least three different conductive elements formed by the first and second conductive fingers and the conductive electrode respectively are used:

- the first lower conductive finger and the upper electrode allow control of the first zone;
- the second conductive finger and the upper electrode allow control of the second zone;
- when both zones are in the crystalline state, a radio frequency signal can be transmitted between the first and second fingers, whereas when both zones are in the amorphous state, the radio frequency signal cannot be transmitted. The radio frequency signal therefore enters through the lower surface of the PCM layer via the first finger and then circulates along the horizontal plane of the PCM layer to exit via the second finger.

As will be described in greater detail below, having at least two controlled zones makes it possible to increase the Roff/Ron ratio substantially (at least by a factor of 10, and even by a factor of 100 or more) compared with the Roff/Ron ratio of a standard PCRAM memory, and thus to obtain Roff/Ron ratios that are quite compatible with the requirements of RF switches. Similarly, by virtue of an aspect of the invention, lower Ron values are obtained than for standard PCRAM memories. Finally, an aspect of the invention makes it possible to have switching times comparable to those of standard PCRAM memories, in the order of 10 to 100 ns for switching from the amorphous phase to the crystalline phase (compared with approximately 1 microsecond for state-of-the-art PCM RF switches) and in the order of 10 ns for switching from the crystalline phase to the amorphous phase (compared with approximately 100 ns for state-of-the-art PCM RF switches). The switch according to an aspect of the invention therefore allows a gain of at least a factor of 10 in switching time compared with state-of-the-art RF PCM switches. It will be noted that the RF switch according to the invention is a directly actuated switch in that it is the current density supplied through the PCM material by the heaters, formed by the lower fingers and the upper electrode, which produces heating necessary for the phase change.

As previously explained, a radiofrequency switch is a switch operating in the radiofrequency range (i.e. from a few kHz to several hundred GHz), or even beyond in the case of applications in the order of a few THz or tens of THz for imaging.

The switch according to an aspect of the invention may also have one or more of the characteristics below, considered individually or according to any technically possible combinations:

- The phase change material is selected from at least one of the following materials: GeTe, GeSbTe, SbTe, GeTeN.
- the first and second conductive fingers are spaced apart by a length of between 10 nm and 200 nm.
- each of the first and second conductive fingers rests respectively on a first and a second conductive connection element, a first and a second conductive pillar for input and output of the radio frequency signal respectively also resting on the first and second conductive connection elements respectively.
- the first and second conductive connection elements rest respectively on another conductive element adapted to be connected to a drive circuit independent of the first and second conductive input and output pillars of the radio frequency signal, such as an output pillar of a CMOS transistor.
- the first conductive finger and/or said second conductive finger and/or the conductive electrode is connected to a first decoupling device between the radio frequency signal and the actuation signal, such as a capacitor for blocking the radio frequency signal.
- the first conductive finger and/or said second conductive finger is connected to a second device for decoupling the radio frequency signal from the actuation signal, such as an inductor for blocking the actuation signal.
- the switch according to an aspect of the invention includes a plurality N, greater than or equal to 3, of conductive fingers spaced apart by a non-zero distance and in contact with the lower surface of the PCM layer, the first and second fingers belonging to the plurality N of fingers, the conveying of an actuation signal through the PCM layer between each conductive finger and the conductive electrode modifying state of the phase-change material in a zone situated between the conductive finger and the conductive electrode.

Another aspect of the invention is a method for actuating a switch according to the invention including:

- a step of conveying an actuation signal of a first type through the PCM layer between the first conductive finger and the conductive electrode modifying state of the phase-change material in a first zone situated between the first conductive finger and the conductive electrode;
- a step of conveying an actuation signal of the first type through the PCM layer between the second conductive finger and the conductive electrode modifying state of the phase-change material in a second zone located between the second conductive finger and the conductive electrode;
- a step of conveying an actuation signal of a second type between the first conductive finger and the second conductive finger, the actuation signal of a second type aiming to correct state of the PCM material in the first and second zones.

An aspect of the invention also relates to a switching system including a plurality of switches according to the invention connected in series.

The switching system according to an aspect of the invention may also include a plurality of switches according to the invention connected in parallel.

The switching system according to an aspect of the invention may also include a matrix including a plurality of switches according to the invention connected in parallel and a plurality of switches according to the invention connected in series.

The invention and its different applications will be better understood upon reading the following description and upon examining the accompanying figures.

BRIEF DESCRIPTION OF THE FIGURES

The figures are set forth by way of indicating and in no way limiting purposes of the invention.

FIG. 1 represents an equivalent circuit of an RF switch.

FIG. 2 illustrates the operation of a PCM RF switch according to prior art.

FIG. 3 represents an example of an indirectly actuated PCM RF switch according to prior art.

FIG. 4 represents a first example of a directly actuated RF PCM switch according to prior art.

FIG. 5 represents a second example of a directly actuated RF PCM switch according to prior art.

FIG. 6 represents a directly actuated RF PCM switch according to the invention.

FIG. 7 and FIG. 8 illustrate the two ON and OFF operating states of the switch of FIG. 6.

FIG. 9 illustrates the OFF state of the switch of FIG. 6 with two separate amorphous zones.

FIG. 10, FIG. 11 and FIG. 12 illustrate differences between the operation of a PCRAM of the state of the art and that of the switch according to the invention.

FIG. 13 illustrates a first embodiment of the decoupling device between the RF signal and the actuation signal in a switch according to the invention.

FIG. 14 illustrates a second embodiment of the decoupling device between the RF signal and the actuation signal in a switch according to the invention.

FIG. 15 illustrates a third embodiment of the decoupling device between the RF signal and the actuation signal in a switch according to the invention.

DETAILED DESCRIPTION

FIG. 6 represents a radio frequency switch 100 according to an aspect of the invention illustrated in an Oxy plane.

The switch 100 includes:

A first conductive finger 101;

A second conductive finger 102;

A conductive electrode 103;

A layer made of a phase change material 104, referred to as the PCM layer;

A first transistor output metal pad 105;

A second transistor output metal pad 106;

An RF signal input pillar 107;

An RF signal output pillar 108;

A first connection via 109;

A second connection via 110.

Beneficially, the manufacture of the switch 100 according to the invention is compatible with CMOS technology. The two CMOS output pads 105 and 106 are thus output pads, for example made of copper, resulting from the manufacture of a CMOS transistor and are, for example, connected to the source or drain of a CMOS transistor: the CMOS transistors can be used to control actuation of the switch 100 according to the invention as will be seen later. A connection via (first and second connection via 109 and 110) made of tungsten, for example, rests on each of the two CMOS output pads 105 and 106 respectively.

The RF signal input pillar 107 is deposited onto the connection via 109 and the RF signal output pillar 108 is deposited onto the connection via 110. The two pillars 107 and 108 are made of copper, for example, each having a lower surface in contact with the upper surface of the via 109 or 110 onto which it is deposited.

The first conductive finger 101 is deposited onto the connection via 109 and its base is in contact with the upper surface of the first connection via 109. The upper end of the first conductive finger 101 is in contact with the lower surface of the PCM layer 104. Illustratively and not restrictively, the first conductive finger is for example L-shaped with a first horizontal leg (i.e. along the axis Ox) in contact with the upper surface of the first connection via 109 and a second vertical leg (i.e. along the axis Oy) in contact with the lower surface of the PCM layer 104.

The second conductive finger 102 is deposited onto the connection via 110 and its base is in contact with the upper surface of the second connection via 110. The upper end of the second conductive finger 102 is in contact with the lower surface of the PCM layer 104. Like the first conductive finger, illustratively and not restrictively, the second conductive finger, for example, L-shaped with a first horizontal leg (i.e. along the axis Ox) in contact with the upper surface of the second connection via 110 and a second vertical leg (i.e. along the axis Oy) in contact with the lower surface of the PCM layer 104.

The contact zones of the first and second conductive fingers with the lower surface of the PCM layer 104 are spaced apart horizontally by a length L1 of, for example, between 10 and 200 nm and in an embodiment in the order of 50 nm.

It will be noted that the switch 100 is produced by a succession of layer deposition, etching and polishing operations not represented here but known to the person skilled in the art. Thus, all the conductive elements are surrounded by an insulating zone 111 formed by one or more dielectric layers, oxides or nitrides for example. The first and second connection via 109 and 110 provide electrical connection between the lower output zone of the CMOS transistors and the upper RF switching zone.

The conductive electrode 103 is deposited onto the upper surface of the PCM layer 104. The lower surface of the conductive electrode 103 faces along the axis Oy the contact zones of the first and second conductive fingers with the lower surface of the PCM layer 104. It will be noted that only one conductive electrode 103 has been represented here. The invention would also apply to the case of two conductive electrodes arranged on the upper surface of the PCM layer, each respectively facing the contact zones of the first and second conductive fingers with the lower surface of the PCM layer. The thickness el of the PCM layer measured along the axis Oy is for example between 25 and 100 nm, and in an embodiment in the order of 50 nm. It will be noted that the PCM layer 104 is a continuous layer of PCM material; in other words, it consists solely of one PCM material or several PCM materials without interruption by a zone of a non-PCM material. The PCM material used may be a chalcogenide material such as GeTe, GeSbTe, SbTe or GeTeN: this list is purely illustrative and not limiting.

The assembly formed by the first and second conductive fingers 101 and 102 and the upper conductive electrode 103 forms a heating device adapted to operate the switch 100 reversibly from a first on state to a second off state as will be described in detail below.

FIGS. 7 and 8 illustrate the two operating states ON (low resistive state) and OFF (high resistive state) of the switch 100 of FIG. 6.

In FIG. 7, the switch 100 is in the ON state. The PCM material of the PCM layer 104 is in a crystalline state such that it allows a radio frequency signal 112 to be conveyed between the first conductive finger 101 and the second conductive finger 102 through the PCM layer 104. As will be seen later, decoupling elements between the RF signal and the switch actuation signal may be necessary to prevent the RF signal from being conveyed to the conductive electrode 103. It is noted that, unlike the PCM RF directly actuated switch of the state of the art, the path followed by the RF signal here is substantially horizontal (i.e. following the Ox direction parallel to the plane of the PCM layer 104).

As illustrated in FIG. 8, when an actuation signal corresponding to a DC current pulse for a very short period of time (i.e. a few nanoseconds) is emitted between the first finger 101 and the conductive electrode 103, the PCM material is heated to partially melt. The signal is then switched off so that the material cools sufficiently quickly to obtain thermal quenching of the material. The PCM material then freezes in an amorphous state without having time to reform the crystal: this change of state occurs in a zone located between the first finger 101 and the conductive electrode 103 so as to form a first amorphous zone 113. The operation is repeated between the second finger 101 and the conductive electrode 103 to form a second amorphous zone 114. It will be noted that the two amorphous zones 113 and 114 intersect here but that the switch according to the invention would also operate with two disjoint amorphous zones as represented in FIG. 9. As the first and second zones of the phase change material 113 and 114 are in the amorphous state, they prevent the radio frequency signal from being conveyed between the first conductive finger 101 and the second conductive finger 102. The switch 100 according to the invention is then in the blocked state.

To return to the on state, another actuation signal in the form of a DC current pulse for a longer period than the previous actuation signal (i.e. from about ten to a hundred nanoseconds) is emitted between the first finger 101 and the conducting electrode 103 so that the PCM material of the zone 113 reorganises into its crystalline state. The same operation is carried out between the second finger 102 and the conductive electrode 103 so that the PCM material in the zone 114 reorganises into its crystalline state. The switch 100 is then in the conducting state as illustrated in FIG. 7.

It is noted here that the switch 100 according to the invention beneficially uses the operating principle of a PCRAM type memory but with at least two memory zones unlike a PCRAM memory which has only one. The switch 100 according to an aspect of the invention also differs from state-of-the-art RF PCM switches in that it does not require the entire volume of the PCM material to be switched. These two memory zones are obtained by virtue of the presence of three terminals (the two fingers 101 and 102 on the lower surface of the PCM layer 104 and the conductive electrode 103 on the upper surface of the PCM layer 104) arranged so as to create and undo the amorphous zones 113 and 114. The presence of these two memory zones enables the structure to meet the requirements of an RF switch, especially in terms of Roff/Ron ratio, unlike PCRAM memories which have much too low Roff/Ron ratios (i.e. in the order of 100): the switch according to an aspect of the invention thus enables a Roff/Ron ratio greater than 1000, or even 10000, to be obtained. This difference between the operation of a known PCRAM and that of the switch according to the invention is schematically illustrated with reference to FIGS. 10 and 11.

FIG. 10 schematically represents a zone 200 of PCM material broken down into 100 square unit cells 201. On the left, the 100 unit cells are in the crystalline state. Since each unit cell has a unit resistance of approximately 1 Ohm in the crystalline state, the zone 200 has a resistance Ron in the ON state approximately equal to 100 Ohms (100 unit cells in series). This resistance Ron is the resistance between the lower input finger 202 and the upper electrode 203. On the right, the unit cell 204 located at finger 202 switches from the crystalline state to the amorphous state. Since each unit cell has a unit resistance of approximately 10 kOhms in the amorphous state, the zone 200 has a Roff resistance in the OFF state approximately equal to 10099 Ohms (99 unit cells at 1 Ohm and 1 unit cell at 10 kOhms in series). This Roff resistance is the resistance between the lower input finger 202 and the upper electrode 203. According to this configuration, the Roff/Ron ratio is therefore substantially equal to 100 (100099/100). A configuration of standard PCRAM memories with a lower electrode (lower finger 202) and an upper electrode 203 is found here. Such a ratio is not compatible with an application using an RF switch.

FIG. 11 schematically represents a zone 300 of PCM material broken down into 100 square unit cells 301. On the left, the 100 unit cells are in the crystalline state. Since each unit cell has a unit resistance of approximately 1 Ohm in the crystalline state, the zone 200 has a resistance Ron in the ON state measured between the lower input finger 302 and the lower output finger 304 approximately equal to 7 Ohm (two half-squares in series each having a resistance of 0.5 Ohm at the input finger 302 and output finger 304 and 6 solid squares each having a resistance of 1 Ohm). On the right, the two unit cells 305 and 306 located respectively at the input finger 302 and output finger 304 switch from the crystalline state to the amorphous state. Since each unit cell has a unit resistance of approximately 10 kOhms in the amorphous state, zone 300 has a Roff resistance in the OFF state measured between input finger 302 and output finger 304 of approximately 10006 Ohms (two half-squares in series each having a resistance of 5000 Ohms at input finger 302 and output finger 304 and 6 solid squares each having a resistance of 1 Ohm). According to this configuration, the Roff/Ron ratio is therefore substantially equal to 1429 (100006/7). It can therefore be seen that a factor greater than 10 is gained here between the configuration of FIG. 11 and that of FIG. 10. The unit zones 305 and 306 are switched by applying an actuating pulse respectively between the input finger 302 and the upper electrode 303 and between the output finger 304 and the upper electrode 303. The input and output fingers 302 and 304 can be assimilated to the first and second fingers 101 and 102 of FIG. 6, while the upper electrode 303 can be assimilated to the conductive electrode 103 of FIG. 6.

The Roff/Ron ratio can be further increased by moving the input and output fingers 302 and 304 closer together, as is illustrated in FIG. 12. In this case, a Ron resistance of 1 Ohm (the two half-squares at the fingers 302 and 304) switches to a Roff resistance of 10,000 Ohms (the two half-squares having switched to the amorphous state and each having a resistance of 5,000 Ohms). In this case, the Roff/Ron ratio is approximately equal to 10,000. In this case, a factor of 100 is gained compared with the PCRAM memory configuration shown in FIG. 10.

It is therefore understood that the switch according to an aspect of the invention beneficially uses the structure of a PCRAM memory including two finger electrodes making it possible to create two memory zones using a third upper electrode, such a configuration making it possible to retain the benefits of a PCRAM memory in terms of switching time while gaining at least a factor of 10, or even 100 or more, on the Roff/Ron ratio.

As has already been mentioned, decoupling elements between the RF signal and the switch actuation signal may be necessary to prevent the RF signal from being conveyed to the conductive electrode 103 of FIG. 6. An example of such decoupling is illustrated in FIG. 13 (the elements in common with FIG. 6 have the same references). Generally speaking, the aim is to prevent the transmission of actuation signals (DC current pulse enabling transition from the crystalline state to the amorphous state and vice versa) to the conductive elements for conveying an RF signal and to block transmission of RF signals to the conductive elements intended solely for the heating device. Here, inductors 115, 116, 119 are respectively connected in series with the copper pillars 107 and 108 (and therefore with the first and second fingers 101 and 102) and with the upper electrode 103 so that only the heating signals can pass through said inductors, the RF signals being blocked. Similarly, capacitors 117 and 118 are respectively connected in series with the copper pillars 107 and 108 (and therefore with the first and second fingers 101 and 102) so that only RF signals can pass through said capacitors, the DC actuation signals being blocked. The inductor 119 in particular prevents the RF signal from passing through the upper conductive electrode 103, the RF signal path being conveyed between the first finger 101 and the second finger 102. The capacitor 117 and inductor 115 pairs (respectively capacitor 118 and inductor 116) form a device for decoupling the RF and DC signals at the RF signal input conductive pillar 107 (respectively RF signal output pillar 108): it is thus possible to inject a DC pulse for actuating the PCM material between the RF signal input conductive pillar 107 and the upper electrode 103 and a DC pulse for actuating the PCM material between the RF signal output conductive pillar 108 and the upper electrode 103 while maintaining the RF signal input/output functions of the pillars 107 and 108. According to a possible alternative, the inductors can be replaced with resistors whose value is chosen to block the RF signals.

Actuation signals (i.e. DC current pulses) for heating the PCM material are provided between each of the conductive fingers and the upper conductive electrode. Insofar as each of the fingers is connected both to an RF input/output conductive pillar and to a CMOS output metal pad, these pulses can be produced between the RF input/output conductive pillar and the conductive electrode (case of FIG. 13) but also between the CMOS output metal pad and the conductive electrode: this embodiment is illustrated in FIG. 14. Here, an inductor 419 is connected in series with the upper electrode 103 so that only heating signals can pass through this inductor, RF signals being blocked. Similarly, capacitors 417 and 418 are respectively connected in series with the copper pillars 107 and 108 (and therefore with the first and second fingers 101 and 102) so that only RF signals can pass through said capacitors, the DC actuation signals being blocked. Finally, inductors 415 and 416 are respectively connected in series with the CMOS output metal pads 105 and 106 (and therefore with the first and second fingers 101 and 102) so that only the heating signals can pass through this inductor, the RF signals being blocked. According to this embodiment, the actuation signals for the two switching zones are respectively made between each output pillar of the CMOS transistor 105, 106 and the upper conductive electrode 103. As previously, capacitors 417 and 418 are used to block the actuation signals. According to this embodiment, the CMOS transistors buried under the structure are beneficially used to actuate the switch. As discussed previously, the transistor output pillars are for example connected to the transistor drain or source.

According to an alternative embodiment, it is also possible to have a combination of the embodiments described with reference to FIGS. 13 and 14. This embodiment is illustrated in FIG. 15. In FIG. 15, inductors 515, 516, 519, 515', 516' are respectively connected in series:

- to the copper pillars 107 and 108 (and therefore to the first and second fingers 101 and 102);
- to the upper electrode 103;
- to the CMOS metal output pads 105 and 106 (and therefore to the first and second fingers 101 and 102), so that only heating signals can pass through said inductors, RF signals being blocked. Capacitors 517 and 518 are respectively connected in series with the copper pillars 107 and 108 so that only RF signals can pass through the capacitors, the DC actuation signals being blocked. It is thus possible to inject a first type of actuation signal from the PCM material both between the CMOS output metal pads 105 and 106 and the upper electrode 103 so as to form or undo the amorphous zones, but also to inject a second type of actuation signal directly between the RF signal input conductive pillar 107 and the RF signal output conductive pillar 108. Unlike the first type of actuation signal, which is injected vertically, the second type of actuation signal is injected horizontally between the two pillars 107 and 108. The benefits of this second type of actuation signal are explained below. Injecting an actuation signal of the first type between the CMOS output metal pads 105 and 106 and the upper electrode 103 enables the two amorphous zones to be created or undone vertically: let's assume that these two amorphous zones are separate as represented in FIG. 9. Injecting a complementary pulse (i.e. of the second type) horizontally increases the volume of the amorphous zones so that they meet, as is the case in FIG. 8.

Conversely, when an actuation pulse aimed at undoing the amorphous zones is injected between the CMOS output metal pads 105 and 106 and the upper electrode 103, the phase change may not be totally reversible and there may still be small amorphous zones present in the PCM layer. Again, the injection of a complementary horizontal pulse makes it possible to remove these remaining amorphous zones where the phase change towards crystallisation has not completely taken place via vertical actuation alone.

In other words, the actuation signal of a second type conveyed horizontally in the PCM layer between the first and second fingers is a signal intended to correct state of both zones created by the actuation signals of the first type.

Even if the Roff/Ron ratio of the RF switch according to the invention is compatible with RF applications, it may be useful to further reduce the value of the Ron resistance when the switch is on in order to reduce insertion losses. To this end, another aspect of the invention is a switching system including a plurality of switches 100 according to the invention connected in parallel. Symmetrically, it may also be useful to increase insulation of the switch by increasing value of the Roff resistor. The switching system according to an aspect of the invention may then include a plurality of switches 100 according to the invention connected in series. The switching system may also have a matrix structure with rows of switches according to an aspect of the invention connected in series and columns of switches according to the invention connected in parallel.

The invention claimed is:

1. A switch adapted to establish or break transmission of a radio frequency signal, said switch including:

- a first conductive finger;
- a second conductive finger, the transmission of said radio frequency signal taking place between the first conductive finger and the second conductive finger;
- at least one conductive electrode;
- a layer made of a phase-change material, referred to as a PCM layer, the phase-change material being able to change state between a crystalline state and an amorphous state, said PCM layer having a lower surface and an upper surface;
- said first and second conductive fingers being spaced apart by a non-zero distance and in contact with the lower surface of the PCM layer;
- said conductive electrode being in contact with the upper surface of the PCM layer;
- conveying an actuation signal through the PCM layer between the first conductive finger and the conductive electrode modifying state of the phase change material in a first zone situated between the first conductive finger and the conductive electrode;

conveying an actuation signal through the PCM layer between the second conductive finger and the conductive electrode modifying state of the phase change material in a second zone situated between the second conductive finger and the conductive electrode;

such that, when the first and second zones of the phase change material are in the crystalline state, the first and second zones allow transmission of the radio frequency signal between the first conductive finger and the second conductive finger through the PCM layer, and, when the first and second zones of the phase change material are in the amorphous state, the first and second zones prevent transmission of the radio frequency signal between the first conductive finger and the second conductive finger through the PCM layer.

2. The switch according to claim 1, wherein the phase-change material is selected from at least one of the following materials: GeTe, GeSbTe, SbTe, GeTeN.

3. The switch according to claim 1, wherein the first and second conductive fingers are spaced apart by a length of between 10 nm and 200 nm.

4. The switch according to claim 1, wherein each of the first and second conductive fingers rests on a first and a second conductive connection element, respectively a first and a second conductive pillar for input and output of the radiofrequency signal respectively also resting on said first and second conductive connection element respectively.

5. The switch according to claim 4, wherein said first and second conductive connection elements respectively rest on another conductive element adapted to be connected to a drive circuit independent of the first and second conductive input and output pillars of the radio frequency signal.

6. The switch according to claim 5, wherein the other conductive element is an output pillar of a CMOS transistor.

7. The switch according to claim 1, wherein said first conductive finger and/or said second conductive finger and/or said conductive electrode is connected to a first device for decoupling the radio-frequency signal from the actuation signal.

8. The switch according to claim 7, wherein the first device for decoupling the radio-frequency signal is a capacitor for blocking the radio-frequency signal.

9. The switch according to claim 1, wherein said first conductive finger and/or said second conductive finger is connected to a second device for decoupling the radio-frequency signal from the actuation signal.

10. The switch according to claim 9, wherein the second device for decoupling the radio-frequency signal is an inductor for blocking the actuation signal.

11. The switch according to claim 1, comprising a plurality N, greater than or equal to 3, of conductive fingers spaced apart by a non-zero distance and in contact with the lower surface of the PCM layer, said first and second fingers belonging to said plurality N of fingers, conveying an actuation signal through the PCM layer between each conductive finger and the conductive electrode modifying state of the phase change material in a zone situated between the conductive finger and the conductive electrode.

12. A method for actuating a switch according to claim 1, the method comprising:

conveying an actuation signal of a first type through the PCM layer between the first conductive finger and the conductive electrode modifying state of the phase-change material in a first zone situated between the first conductive finger and the conductive electrode;

conveying an actuation signal of the first type through the PCM layer between the second conductive finger and the conductive electrode modifying state of the phase-change material in a second zone situated between the second conductive finger and the conductive electrode;

conveying an actuation signal of a second type between the first conductive finger and the second conductive finger, said actuation signal of a second type being intended to correct state of the PCM material in the first and second zones.

13. A switching system comprising a plurality of switches according to claim 1 connected in series.

14. A switching system comprising a plurality of switches according to claim 1 connected in parallel.

15. A switching system comprising a matrix including a plurality of switches according to claim 1, some of said plurality of switches being connected in parallel and some of said plurality of switches being connected in series.

* * * * *